(12) United States Patent
Matsuo

(10) Patent No.: US 7,951,521 B2
(45) Date of Patent: May 31, 2011

(54) TRANSFER SUBSTRATE, TRANSFER METHOD, AND METHOD OF MANUFACTURING DISPLAY DEVICE

(75) Inventor: Keisuke Matsuo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/900,953

(22) Filed: Oct. 8, 2010

(65) Prior Publication Data

US 2011/0027502 A1    Feb. 3, 2011

Related U.S. Application Data

(62) Division of application No. 11/561,709, filed on Nov. 20, 2006, now Pat. No. 7,887,987.

(30) Foreign Application Priority Data

Nov. 21, 2005   (JP) ................. 2005-335310

(51) Int. Cl.
*G03C 8/00* (2006.01)
*G03F 7/00* (2006.01)
*B41M 5/40* (2006.01)

(52) U.S. Cl. ............ 430/200; 428/32.63; 430/199; 430/201

(58) Field of Classification Search ........ 430/270.1, 430/199, 200, 201; 428/32.63
See application file for complete search history.

(56) References Cited

U.S. PATENT DOCUMENTS

| 5,688,551 | A | 11/1997 | Littman et al. |
| 2005/0266186 | A1 | 12/2005 | Nguyen et al. |
| 2006/0084006 | A1 | 4/2006 | Kang et al. |

FOREIGN PATENT DOCUMENTS

| JP | 09-167684 | 6/1997 |
| JP | 2002-216957 | 8/2002 |
| JP | 2004-071551 | 10/2004 |

*Primary Examiner* — Amanda C. Walke
(74) *Attorney, Agent, or Firm* — SNR Denton US LLP

(57) ABSTRACT

A transfer substrate including a transfer material layer on a support substrate with a light absorbing layer. Antireflection patterns for preventing light reflection on an interface of the support substrate and the light absorbing layer are provided between the support substrate and the light absorbing layer. Thickness of the antireflection patterns is set to a value with which an absorptance of light having a predetermined wavelength absorbed in the light absorbing layer is maximized.

3 Claims, 11 Drawing Sheets

FIG. 4
FIG. 4A
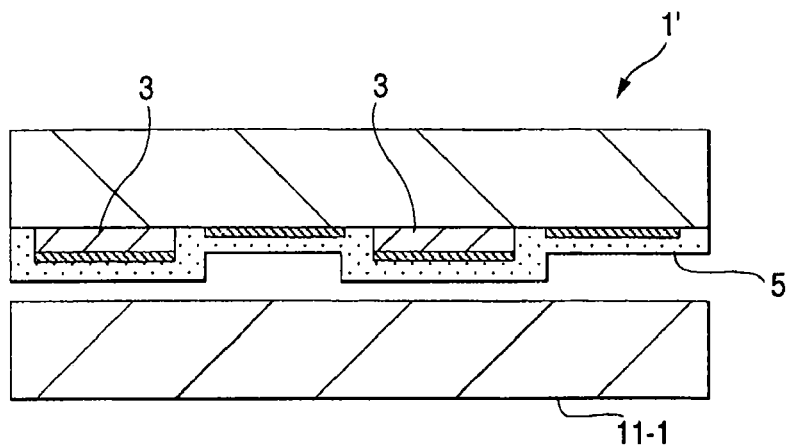
FIG. 4B
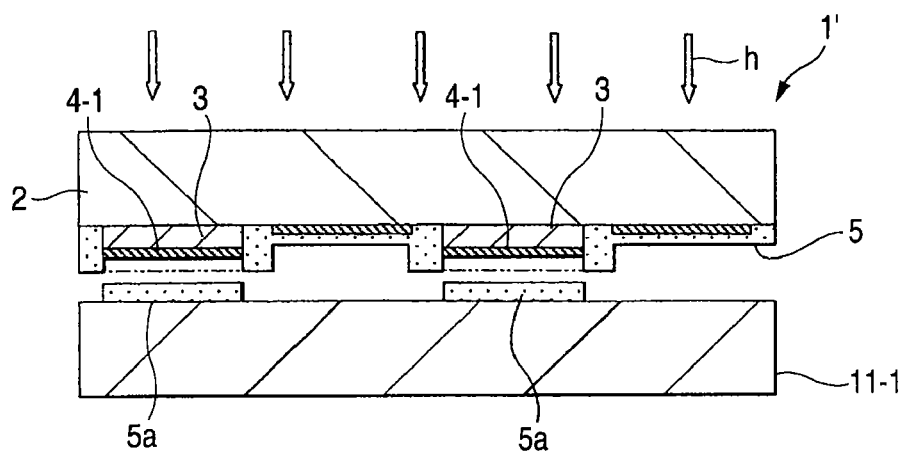

ID. TRANSFER SUBSTRATE, TRANSFER METHOD, AND METHOD OF MANUFACTURING DISPLAY DEVICE

RELATED APPLICATION DATA

This application is a division of U.S. patent application Ser. No. 11/561,709, filed Nov. 20, 2006, the entirety of which is incorporated herein by reference to the extent permitted by law. The present application claims the benefit of priority to Japanese Patent Application No. JP 2005-335310 filed in the Japanese Patent Office on Nov. 21, 2005, the entirety of which is incorporated by reference herein to the extent permitted by law.

BACKGROUND OF THE INVENTION

The present invention relates to a transfer substrate and a transfer method for sublimating, with irradiation of a heat source, a transfer material layer formed on a support substrate and transferring the transfer material layer to a receptor substrate side and a method of manufacturing a display device to which this transfer method is applied.

An organic electroluminescence element that utilizes electroluminescence of an organic material includes an organic layer, in which a hole transport layer and a light emitting layer are stacked, between a lower electrode and an upper electrode. The organic electroluminescence element attracts attention as a light emitting element that is capable of performing high-intensity light emission by low-voltage direct-current driving.

In a full-color display device in which such an organic electroluminescence element (hereinafter simply referred to as light emitting element) is used, light emitting elements that emit lights of R (red), G (green), and B (blue) are formed to be arrayed on a substrate. In manufacturing such a display device, it is one of important elements to selectively form each luminous organic material layer on an electrode as a fine pattern.

As a method of forming a pattern of such an organic material layer, a transfer method in which an energy source (a heat source) is used, that is, a thermal transfer method has been proposed. In one example of a method of manufacturing a display device in which the thermal transfer method is used, first, a lower electrode is formed on a substrate of a display device (hereinafter referred to as device substrate). On the other hand, a light emitting layer is formed on another substrate (hereinafter transfer substrate) via a light absorbing layer. In a state in which the light emitting layer and the lower electrode are opposed to each other, the device substrate and the transfer substrate are arranged and a laser beam is irradiated from the transfer substrate side to thermally transfer the light emitting layer onto the lower electrode of the device substrate. In this case, the lower electrode is scanned by the laser beam spot-irradiated. Consequently, the light emitting layer is thermally transferred to only a predetermined area on the lower electrode with high positional accuracy to be formed as a pattern (see JP-A-09-167684 and JP-A-2002-216957).

SUMMARY OF THE INVENTION

However, in the thermal transfer method described above, the light emitting layer is formed as a pattern by thermal transfer according to scanning of the laser beam spot-irradiated. Therefore, a certain degree of time is necessary for forming the light emitting layer over the entire surface of the device substrate as patterns. This causes deterioration in production efficiency of the display device.

It is mentioned in JP-A-09-167684 that a patternized light absorbing layer may be provided on the transfer substrate. However, light-heat conversion efficiency by the light absorbing layer is about 40%. A quantity of laser beams effectively acting on the thermal transfer of the light emitting layer is only about 400 of a quantity of irradiated laser beams.

Thus, it is desirable to provide a transfer substrate and a transfer method with which it is possible to effectively perform formation of transfer patterns by thermal transfer and realize improvement of production efficiency and a method of manufacturing a display device.

According to an embodiment of the invention, there is provided a transfer substrate including a transfer material layer on a support substrate via a light absorbing layer, wherein antireflection patterns for preventing light reflection on an interface of the support substrate and the light absorbing layer is provided between the support substrate and the light absorbing layer. Film thickness of this antireflection patterns is set to a value with which an absorptance of light having a predetermined wavelength absorbed in the light absorbing layer is maximized.

Since the antireflection patterns having such film thickness are provided between the support substrate and the light absorbing layer, the light having the predetermined wavelength irradiated from the support substrate side is efficiently absorbed and converted into heat in light absorbing layer portions on the antireflection patterns.

According to another embodiment of the invention, there is provided a transfer method of transferring a transfer material layer on the surface of a transfer substrate onto a receptor substrate by thermal transfer. First, in a first step, a transfer substrate provided with antireflection patterns, a light absorbing layer, and a transfer material layer on a support substrate in this order is prepared. In a second step, in a state in which the transfer material layer faces the receptor substrate side, the transfer substrate is arranged to be opposed to the receptor substrate. Thereafter, in a third step, light having a predetermined wavelength is irradiated from the support substrate side. The light is absorbed and converted into heat in the light absorbing layer as well as the antireflection patterns. Consequently, transfer material layer portions on the antireflection patterns are thermally transferred to the receptor substrate side selectively.

According to still another embodiment of the invention, there is provided a method of manufacturing a display device in which the transfer method is used, wherein a transfer material layer containing a light emitting material is used and a functional layer having the transfer material layer thermally transferred onto first electrodes in a device substrate is formed.

BRIEF DESCRIPTION OF THE DRAWINGS

In the accompanying drawings:

FIGS. 4A to 4D are sectional views for explaining steps of a transfer method according to the second embodiment;

DESCRIPTION OF THE PREFERRED EMBODIMENTS

Embodiments to which the invention is applied will be hereinafter explained in detail with reference to the drawings. In the respective embodiments, a structure of a transfer substrate assumed to be used in, for example, forming a light emitting layer in manufacturing of a display device in which organic electroluminescence elements are formed to be arrayed will be explained. Subsequently, a transfer method in which this transfer substrate is used will be explained.

First Embodiment

Figure 1:
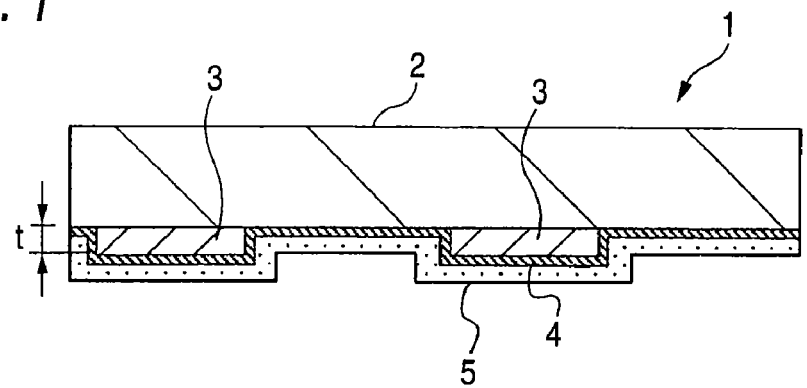
FIG. 1 is a main part sectional view for explaining a structure of a transfer substrate by a first embodiment of the invention.

FIG. 1 is a main part sectional view for explaining a structure of a transfer substrate according to a first embodiment of the invention. A transfer substrate 1 shown in the figure includes a support substrate 2, antireflection patterns 3 provided on the support substrate 2, a light absorbing layer 4 provided on the support substrate 2 to cover the antireflection patterns 3, and a transfer material layer 5 provided on the light absorbing layer 4.

The support layer 2 has satisfactory light transmission properties with respect to light h having a predetermined wavelength irradiated in transfer in which the transfer substrate 1 is used. The support substrate 2 is made of, for example, a glass substrate.

The antireflection patterns 3 have an effect of preventing light reflection on an interface of the support substrate 2 and the light absorbing layer 4. As such antireflection patterns 3, in particular, antireflection patterns having a real part of a refractive index exceeding 3.0 are desirable. The antireflection patterns are made of, for example, silicon (Si). The antireflection patterns 3 are formed on the support substrate 2 in a shape (including an arrangement state) corresponding to transfer patterns formed on a receptor substrate side by the transfer in which the transfer substrate 1 is used. In particular, film thickness t of the antireflection patterns 3 is set to a value with which a light absorptance with respect to light h is maximized. For example, when a semiconductor laser beam having a wavelength of 800 nm is used as the light h to be irradiated, the film thickness t of the antireflection patterns 3 made of silicon is set to 40 nm. In a silicon film with the thickness of 40 nm, an absorptance with respect to a semiconductor laser beam having a wavelength of 800 nm shows a maximum value. Such antireflection patterns 3 are formed by formation of a silicon film in the CVD method and pattern etching of a silicon film in which a resist pattern formed by the photolithography method is used.

The light absorbing layer 4 is made of a material that efficiently absorbs light irradiated from the support substrate 2 side and converts the light into heat, for example, a metal material having a low reflectance such as chrome (Cr). Such a light absorbing layer 4 is formed over the entire surface of the support substrate 2 by, for example, the sputtering method to cover the antireflection patterns 3.

The transfer material layer 5 is made of a material transferred to be formed by thermal transfer in which the transfer substrate 1 is used, for example, an organic material containing a light emitting material. The transfer material layer 5 may have a single layer structure or may have a laminated structure. The transfer material layer 5 is formed on the support substrate 2 via the light absorbing layer 4. Such a transfer material layer is formed by the evaporation method, the application method, or the printing method.

Figure 2A:
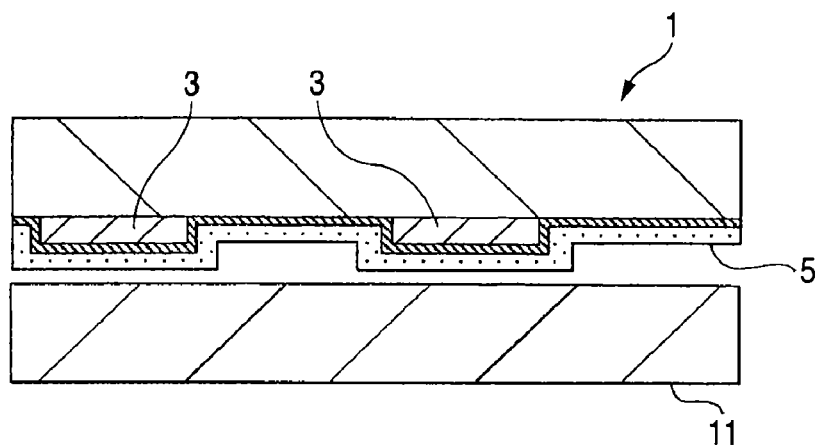
FIGS. 2A and 2B are sectional views for explaining steps of a transfer method according to the first embodiment.
Figure 2B:
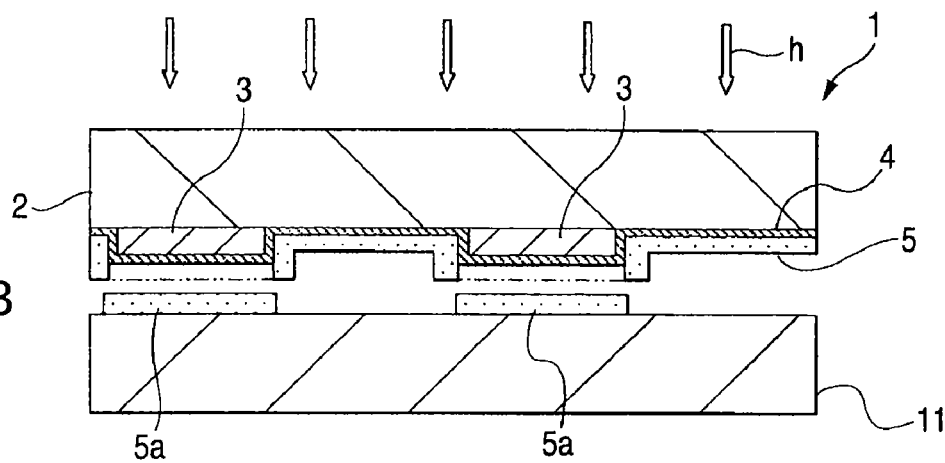

FIGS. 2A and 2B are sectional views for explaining steps of a transfer method in which the transfer substrate having the structure described above is used. The transfer method will be explained with reference to FIGS. 2A and 2B.

First, as shown in FIG. 2A, a receptor substrate 11 to be an object of transfer is prepared. The receptor substrate 11 is, for example, a device substrate that constitutes a display device. In the receptor substrate 11, a thin film transistor (TFT) for pixel driving and first electrodes connected to the TFT are formed on a glass substrate as patterns. On a pattern formation surface in the receptor substrate 11, alignment marks made of a layer identical with a layer of the TFT and the first electrodes is formed. When necessary, a charge injection layer and a charge transport layer are provided to cover the first electrodes and the alignment marks.

The transfer substrate 1 is arranged to be opposed to the receptor substrate 11. In this case, the pattern formation surface (the alignment mark formation surface) in the receptor substrate 11 and the transfer material layer 5 in the transfer substrate 1 are arranged to face each other. An arrangement state of the transfer substrate 1 with respect to the receptor substrate 11 is adjusted such that the alignment marks on the receptor substrate 11 side and alignment marks on the transfer substrate 1 side are in a predetermined positional relation. In this state, the transfer substrate 1 placed on the receptor substrate 11 and a space between the substrates 1 and 11 is decompressed to cause the substrates 1 and 11 to adhere to each other. In the figure, for convenience of explanation, the space provided between the substrates 1 and 11 is shown.

Subsequently, as shown in FIG. 2B, the light h having the predetermined wavelength is irradiated from the support substrate 2 side in the transfer substrate 1. The light h has a wavelength that is transmitted through the support substrate 2 and with which an absorptance in the antireflection patterns 3 is maximized. As explained with reference to FIG. 1, when the antireflection patterns 4 are made of silicon having film thickness of 40 nm, a semiconductor laser beam having a wavelength of 800 nm is irradiated as the light h. The light h to be irradiated may be collectively irradiated on a wide area including the antireflection patterns 3. However, it is important that an amount of irradiation of the light h is an amount of irradiation equal to or larger than an amount of irradiation with which the transfer material layer 5 portions on the antireflection patterns 3 are sufficiently sublimated and transferred and is an amount of irradiation in a range in which the transfer material layer 5 portions in portions where the antireflection patterns 3 are not provided are not sublimated.

Consequently, the light h is absorbed and converted into heat in the light absorbing layer 4 as well as the antireflection patterns 3 and the transfer material layer 5 portions on the antireflection patterns 3 are thermally transferred onto the receptor substrate 11 selectively to form a transfer pattern 5a.

In manufacturing a display device, after the formation of the transfer patterns 5a, a step of stacking a layer on the transfer patterns 5a to form upper electrodes is performed. Manufacturing of a display device will be explained in detail in a third embodiment of the invention.

According to the first embodiment described above, the transfer substrate 1 is manufactured to be the structure in which the antireflection patterns 3 are provided between the support substrate 2 and the light absorbing layer 4. As explained with reference to FIG. 2B, from the support substrate 2 side, by irradiating the light h having a wavelength with which an absorptance in the light absorbing layer 4 portions on the antireflection patterns 3 is maximized, it is possible to secure a large difference of amounts of light absorption in portions where the antireflection patterns 3 are provided and portions where the antireflection patterns 3 are not provided. This makes it possible to thermally transfer only the transfer material layer 5 portions on the antireflection patterns 3 selectively to form the transfer patterns 5a by light irradiation on the wide area including the antireflection patterns 3. In other words, it is possible to form the transfer patterns 5a by collective exposure. Moreover, in the antireflection patterns 3 and the light absorbing layer 4 portions above the antireflection patterns 3, it is possible to efficiently absorb light and form the transfer patterns 5a. Thus, it is possible to realize improvement of efficiency of use and efficiency of production in the formation of the transfer patterns 5a.

Second Embodiment

Figure 3:
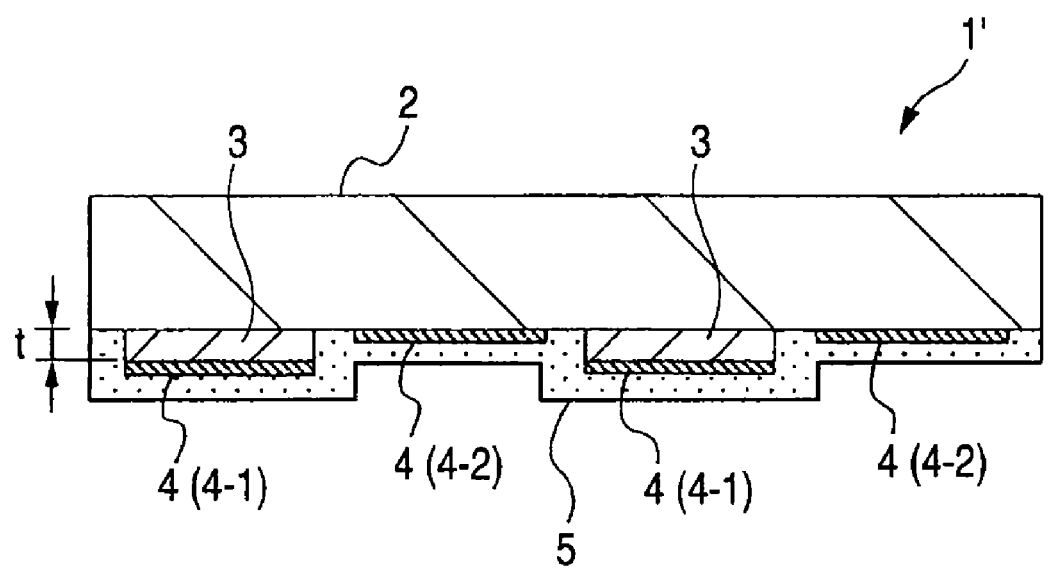
FIG. 3 is a main part sectional view for explaining a structure of a transfer substrate according to a second embodiment of the invention.

FIG. 3 is a main part sectional view for explaining a structure of a transfer substrate according to a second embodiment of the invention. A transfer substrate 1' shown in the figure is different from the transfer substrate explained with reference to FIG. 1 in the first embodiment in that the light absorbing layer 4 is patterned, but otherwise the transfer substrate 1' is the same as the transfer substrate.

The light absorbing layer 4 is patterned in portions where the antireflection patterns 3 are provided and portions where the antireflection patterns 3 are not provided. For example, in the portions where the antireflection patterns 3 are provided, the light absorbing layer 4 is patterned in a shape substantially identical with the antireflection patterns 3 and, in the portions where the antireflection patterns 3 are not provided, the light absorbing layer 4 is patterned in, for example, a shape identical with that on the antireflection patterns 3. An array state of light absorbing layers 4-1 formed in the portions where the antireflection patterns 3 are provided and an array state of light absorbing layers 4-2 formed in the portions where the antireflection patterns 3 are not provided may be identical.

The transfer material layer 5 is formed over the entire surface of the support substrate 2 to cover the light absorbing layer 4 patterned in this way.

FIGS. 4A to 4D are sectional views for explaining steps of a transfer method in which the transfer substrate 1' having the structure described above is used. The transfer method will be explained with reference to FIGS. 4A to 4D.

First, as shown in FIG. 4A, a first receptor substrate 11-1 to be an object of transfer is prepared. The receptor substrate 11-1 is, for example, a device substrate that constitutes a display device and is the same as the receptor substrate explained with reference to FIGS. 2A and 2B in the first embodiment in that alignment marks (not shown) are formed on a pattern formation surface. The transfer substrate 1' is arranged to be opposed to the receptor substrate 11-1 in a predetermined state. An arrangement state of the transfer substrate 1' with reference to the receptor substrate 11-1 is the same as the arrangement state of the transfer substrate and the receptor substrate explained with reference to FIG. 2A in the first embodiment.

As shown in FIG. 4B, the light h having a predetermined wavelength is irradiated from the support substrate 2 side in the transfer substrate 1'. The light h has a wavelength that is transmitted through the support substrate 2 and with which an absorptance in the antireflection patterns 3 is maximized. In other words, as explained in the first embodiment, when the antireflection patterns 3 are made of silicon having film thickness of 40 nm, a semiconductor laser beam having a wavelength of 800 nm is irradiated as the light h. The light h irradiated may be collectively irradiated on a wide area including the antireflection pattern 3. However, it is important that an amount of irradiation of the light h is an amount of irradiation equal to or larger than an amount of irradiation with which the transfer material layer 5 portions on the antireflection patterns 3 are sufficiently sublimated and transferred and is an amount of irradiation in a range in which the transfer material layer 5 portions in portions where the antireflection patterns 3 are not provided are not sublimated.

Consequently, the light h is absorbed and converted into heat in the light absorbing layer 4-1 as well as the antireflection patterns 3 and the transfer material layer 5 portions on the antireflection patterns 3 are thermally transferred onto the receptor substrate 11-1 selectively to form the transfer pattern 5a. The transfer pattern 5a is formed as, for example, a light emission layer pattern of an organic electroluminescence element containing a light emitting material.

Figure 4C:
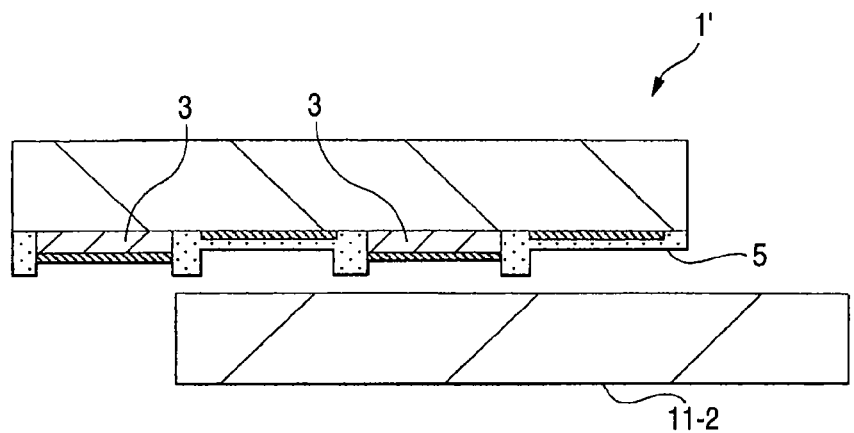

Subsequently, as shown in FIG. 4C, a second receptor substrate 11-2 to be an object of transfer is prepared. The receptor substrate 11-2 has the same structure as the first receptor substrate 11-1 and alignment marks (not shown) are formed on a pattern formation surface thereof. The transfer substrate 1' used for the transfer is arranged to be opposed to such a receptor substrate 11-2 in a predetermined state. An arrangement state of the transfer substrate 1' with respect to the second receptor substrate 11-2 is the same as an arrangement state of the transfer substrate 1' with respect to the first receptor substrate 11-1. However, a positional relation of the alignment marks may be a peculiar positional relation determined between the second receptor substrate 11-2 and the transfer substrate 1'.

Figure 4D:
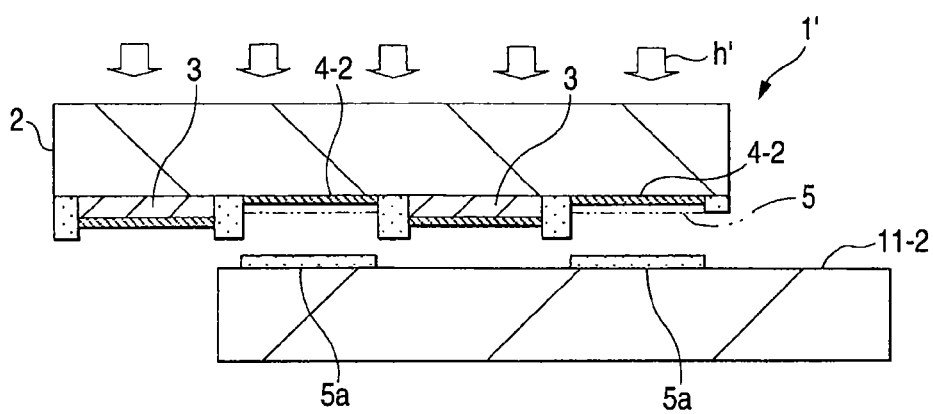

Thereafter, as shown in FIG. 4D, light h' is irradiated from the support substrate 2 side in the transfer substrate 1'. In this case, the light h' to be irradiated may be collectively irradiated on a wide area including the antireflection patterns 3. However, it is important to set an amount of irradiation of the light h' in a range in which the transfer material layer 5 portions left on the light absorbing layer 4, that is, the transfer material layer 4 portions on the light absorbing layers 4-2 among the antireflection patterns 3 are sufficiently sublimated.

The light h' to be irradiated may be light having the same wavelength as the light h used in the transfer to the first receptor substrate 11-1 or a wavelength having a low absorptance in the antireflection patterns 3 may be selected.

Consequently, the light h' is absorbed in the light absorbing layer 4-2 patterned in the portions where the antireflection patterns 3 are not provided and is converted into heat and the transfer material layer 5 portions on the light absorbing layers 4-2 are thermally transferred onto the receptor substrate 11-2 selectively to form the transfer patterns 5a. The transfer patterns 5a are formed on the receptor substrate 11-2, which is different from the receptor substrate 11-1 on which the transfer patterns 5a are formed, as, for example, a light emitting layer pattern of an organic electroluminescence element containing a light emitting material.

In manufacturing a display device, after the formation of the transfer patterns 5a, a step of stacking a layer on the transfer patterns 5a to form upper electrodes is applied to the receptor substrate 11-1 and the receptor substrate 11-2. Manufacturing of a display device will be explained in detail in the third embodiment of the invention.

According to the second embodiment explained above, as in the first embodiment, the antireflection patterns 3 are provided and the light h having the same wavelength is irradiated to form the transfer patterns 5a. Thereafter, as explained with reference to FIG. 4D, light in a range in which the transfer material layer 5 portions on the light absorbing layers 4 (4-2) are sufficiently sublimated is irradiated to form the transfer patterns 5a again. Consequently, in addition to the effect of the first embodiment, it is possible to transfer the transfer material layer 5 formed on the transfer substrate 1' without waste and form the transfer patterns 5a. This makes it possible to realize a reduction in manufacturing cost of a display device to which such a transfer method is applied. In particular, when a film-like substrate is used as the support substrate 2 of the transfer substrate 1' instead of the glass substrate, since the film-like substrate having a high transmittance with respect to the light h is expensive, the reduction in manufacturing cost by the application of the second embodiment is effective.

It is also possible to perform the transfer method according to the second embodiment, which is explained with reference to the sectional views in FIGS. 4A to 4D, using the transfer substrate 1 according to the first embodiment explained with reference to FIG. 1. Even in this case, it is possible to transfer the transfer material layer 5 portions, which are left on the light absorbing layer 4 in the pattern transfer by first collective exposure explained with reference to FIG. 4B, as patterns by second collective exposure explained with reference to FIG. 4D.

Third Embodiment

Figure 5:
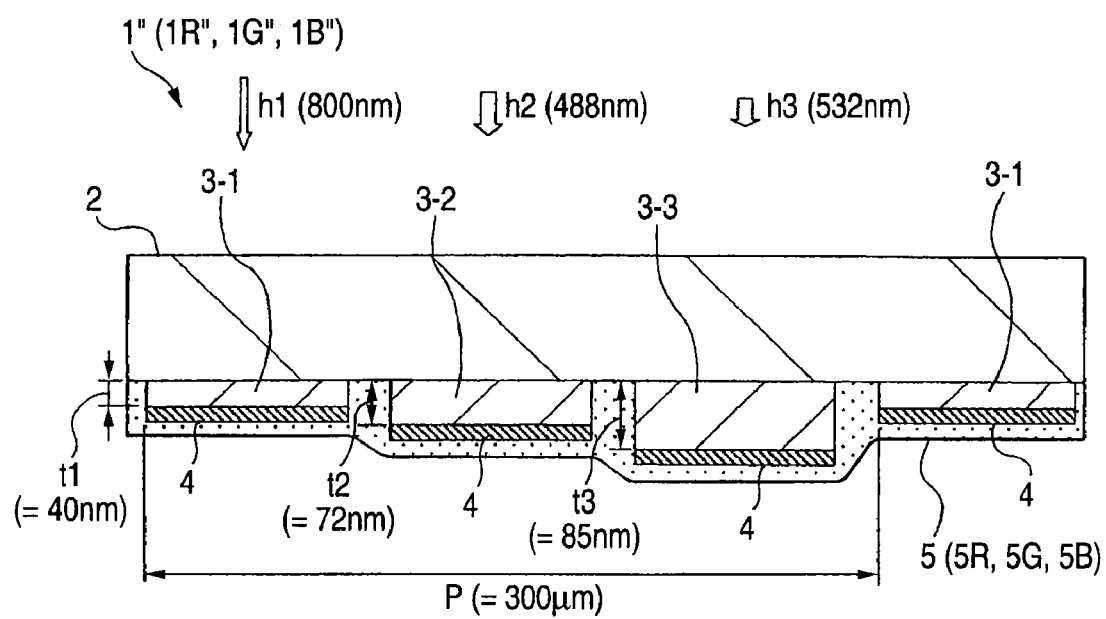
FIG. 5 is a main part sectional view for explaining a structure of a transfer substrate according to a third embodiment of the invention.

FIG. 5 is a main part sectional view for explaining a structure of a transfer substrate according to a third embodiment of the invention. A transfer substrate 1" shown in the figure is suitably used in manufacturing a full color display device in which an organic electroluminescence element is used. Components identical with those in the first and the second embodiments are denoted by the identical reference numerals and signs and redundant explanations are omitted.

The transfer substrate 1" shown in the figure includes the support substrate 2, antireflection patterns 3-1, 3-2, and 3-3 provided on the support substrate 2, the light absorbing layers 4 formed on the antireflection patterns 3-1, 3-2, and 3-3, and the transfer material layer 5 provided on the light absorbing layers 4.

The support substrate 2 has satisfactory light transmission properties with respect to lights h1 to h3 having predetermined wavelengths irradiated in transfer in which the transfer substrate 1" is used. As in the first embodiment, the support substrate 2 is made of, for example, a glass substrate.

The respective antireflection patterns 3-1, 3-2, and 3-3 have an effect of preventing light reflection on interfaces of the support substrate 2 and the light absorbing layers 4. As in the first embodiment, the antireflection patterns 3-1, 3-2, and 3-3 are made of, for example, silicon (Si). Film thicknesses t1 to t3 of the respective antireflection patterns 3-1, 3-2, and 3-3 are set such that light absorptances with respect to the lights h1 to h3 having the predetermined wavelengths irradiated on the transfer substrate 1" are maximized.

A semiconductor laser beam having a wavelength of 800 nm, an argon ion laser beam having a wavelength of 488 nm, and a neodymium (Nd):YAG laser beam having a wavelength of 532 nm are used as the lights h1, h2, and h3 irradiated, respectively, the film thickness t1 of one antireflection pattern 3-1 is set to 40 nm with which a light absorptance with respect to the wavelength 800 nm of the light h1 is maximized. The film thickness t2 of another antireflection pattern 3-2 is set to 72 nm with which a light absorptance with respect to the wavelength 488 nm of the light h2 is maximized. The film thickness t3 of still another antireflection pattern 3-3 is set to 85 nm with which a light absorptance with respect to the wavelength 532 nm of the light h3 is maximized.

Concerning the case in which antireflection patterns made of silicon having the film thicknesses t1 to t3 described above are provided, in FIG. 6, a relation between a wavelength [nm] of irradiated light and light absorptances [%] in the antireflection patterns and the light absorbing layers is shown. As the light absorbing layers, chrome films having thickness of 200 nm are used.

Figure 6:
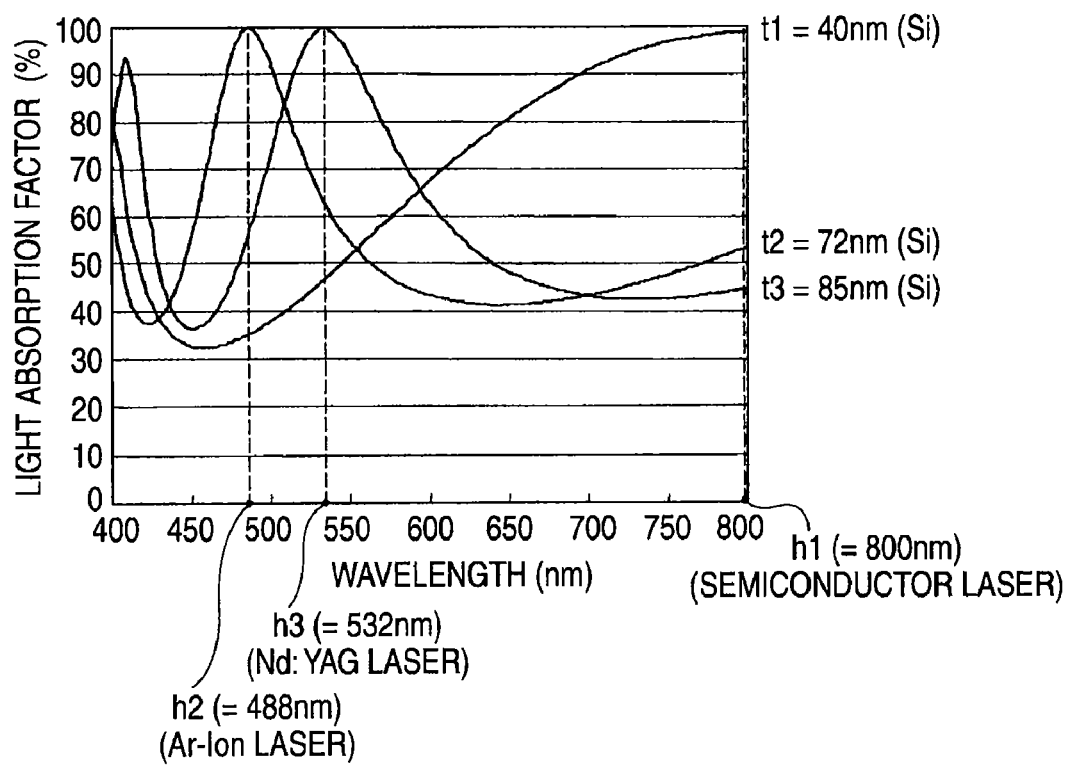
FIG. 6 is a graph showing, in the case in which antireflection patterns made of silicon having film thicknesses t1 to t3 are provided, a relation between a wavelength [nm] of irradiated light and light absorptance [%] in the antireflection patterns and the light absorbing layers.

As shown in a graph in FIG. 6, it is seen that a wavelength of light with which light absorptances [%] in the antireflection patterns and the light absorbing layers are maximized are different depending on film thicknesses of the antireflection patterns (silicon) provided below the light absorbing layers. In association with the lights h1 to h3 having the respective wavelengths irradiated on the transfer substrate 1", the film thicknesses t1 to t3 of the respective antireflection patterns 3-1 to 3-3 made of silicon are set such that light absorptances [%] of the lights h1 to h3 are maximized.

It is preferable that the lights h1 to h3 irradiated on the transfer substrate 1" and the film thickness t1 to t3 of the respective antireflection patterns 3-1, 3-2, and 3-3 are selected such that, for example, a difference between a light absorptance of the light h1 with respect to one antireflection pattern 3-1 and a light absorptance of the light h1 with respect to the other two antireflection patterns 3-2 and 3-3 is equal to or larger than 30%. The light absorptances are in a correspondence relation. By setting such a difference in light absorptances, selectivity in thermally transferring only the transfer material layer 5 portion on one antireflection pattern 3-1 by, for example, irradiation of the light h1 is made sure.

The respective antireflection patterns 3-1 to 3-3 set to the film thicknesses t1 to t3 are formed, by transfer in which the transfer substrate 1" is used, on the support substrate 2 in a shape (including an arrangement state) corresponding to transfer patterns formed on the receptor substrate side. In other words, the antireflection patterns 3-1 are formed, by the transfer in which the transfer substrate 1 is used, to be arrayed on the support substrate 2 to correspond to transfer patterns formed on the receptor substrate side. For example, the antireflection patterns 3-1 are formed in a rectangular shape, formed to be arrayed in one direction at a pitch P of 300 μm, and formed to be arrayed in a matrix shape in the other direction perpendicular to one direction at a pitch identical with that of pixels of the display device. The antireflection patterns 3-2 are formed to be arrayed on the support substrate 2 while keeping the same array state as the antireflection patterns 3-1. Moreover, the antireflection patterns 3-3 are formed to be arrayed while keeping the same array state.

The light absorbing layers 4 are made of a material that efficiently absorbs light irradiated from the support substrate 2 side and converts the light into heat, for example, a metal material having a low reflectance such as chrome (Cr). Here, the light absorbing layers 4 are formed using a chrome film having film thickness of 200 nm. Such light absorbing layers 4 are formed as patterns in a shape substantially identical with the shape of the antireflection patterns 3-1 to 3-3. The light absorbing layers 4 may be formed on the entire surface of the support substrate 2 to cover the antireflection patterns 3-1 to 3-3.

The antireflection patterns 3-1 to 3-3 are formed as described below. As a first method, a silicon film having thickness t1 and a chrome film having thickness of 200 nm are formed in this order and, then, the silicon film and the chrome film are patterned to obtain the antireflection patterns 3-1 made of the silicon film having the thickness t1 and the light absorbing layers 4 made of the chrome film above the antireflection patterns 3-1. Thereafter, the same process is repeated by changing thickness of the silicon film. As a second method, the antireflection patterns 3-1 to 3-3 having film thicknesses t1 to t3, respectively, are formed by performing film formation (e.g., the CVD method), in which three masks are used, three times. In the film formation in which the respective masks are used, film formation for forming the light absorbing layer 4 may be performed following the film formation for forming the antireflection patterns 3-1 to 3-3.

The transfer material layer 5 is made of a material transferred to be formed by thermal transfer in which the transfer substrate 1" is used, for example, an organic material containing light emitting materials of respective colors. Such a transfer material layer 5 may contain, together with the light emitting materials of the respective colors, at least one kind of a hole transporting material, an electron transporting material, and a both-charges transporting material. Such a transfer material layer 5 may have a single layer structure or may have a laminated structure. The transfer material layer 5 is formed on the entire surface of the support substrate 2 via the light absorbing layers 4.

For example, when a red light emitting layer is formed as a transfer pattern by the transfer in which the transfer substrate 1" is used, as an example of a red transfer material layer 5R, a material layer obtained by mixing 30 weight % of 2,6-bis[(4'-methoxydiphenylamino)styryl]-1,5-dicyanonaphthalene (BSN), which is a red light emitting material, in 9,10-di-(2-naphthyl)-anthracene (ADN), which is a hole transporting material, is formed with film thickness of 30 nm and used.

When a green light emitting layer is formed as a transfer pattern by the transfer in which the transfer substrate 1" is used, as an example of a green transfer material layer 5G, a material layer obtained by mixing 5 weight % of coumarin 6, which is a green light emitting material, in ADN is formed with film thickness of 30 nm and used.

When a blue light emitting layer is formed as a transfer pattern by the transfer in which the transfer substrate 1" is used, as an example of a blue transfer material layer 5B, a material layer obtained by mixing 4,4'-bis[2-{4-(N,N-diphenylamino)phenyl}vinyl]biphenyl (DPAVBi), which is a blue light emitting material, in the ADN is formed with film thickness of 30 nm and used.

An embodiment of application of the transfer method in which the transfer substrate 1" is used to a method of manufacturing a display device will be explained.

First, the transfer substrates 1" having the structure explained with reference to FIG. 5 are prepared. Three transfer substrates 1" (1R", 1G", 1B"), namely, a transfer substrate 1R" that has the red transfer material layers 5R, a transfer substrate 1G" that has the green transfer material layers 5G, and a transfer substrate 1B" that has the blue transfer material layers 5B are prepared. As explained later, in association with the pitch P of 300 μm, three sets of alignment marks are provided in the respective transfer substrates 1". The alignment marks can be positioned with respective receptor substrates 1" when positions of the transfer substrates 1" are shifted by P/3 with respect to the receptor substrates and arranged to be opposed to one another.

Figure 7:
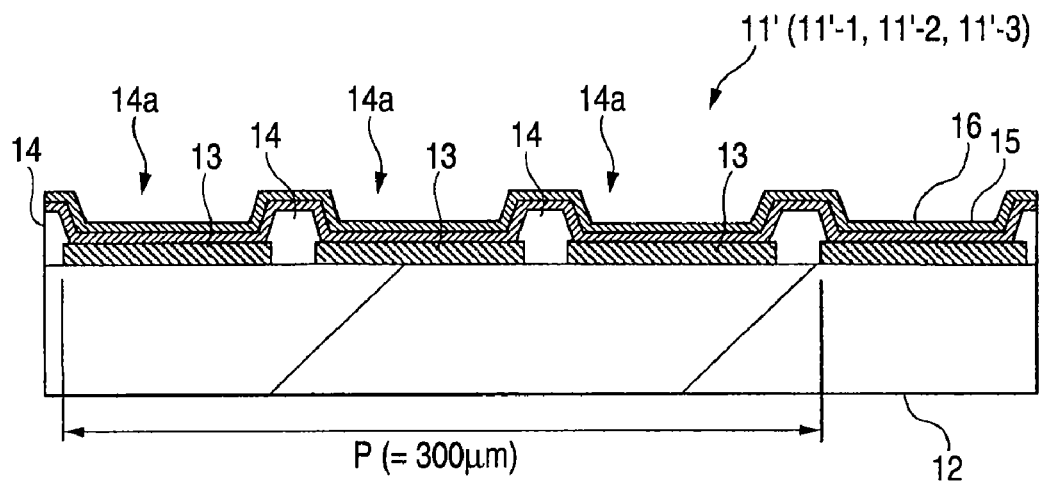
FIG. 7 is a sectional view of a receptor substrate used for manufacturing of a display device to which a transfer method according to the third embodiment is applied.

On the other hand, a device substrate shown in FIG. 7 is manufactured as the receptor substrate 11' as described below.

First, first electrodes 13 made of ITO are formed as patterns on a glass substrate 12. Although not shown in the figure, alignment marks are formed on the glass substrate 12 in a process identical with the formation of the first electrodes 13.

Figure 8:
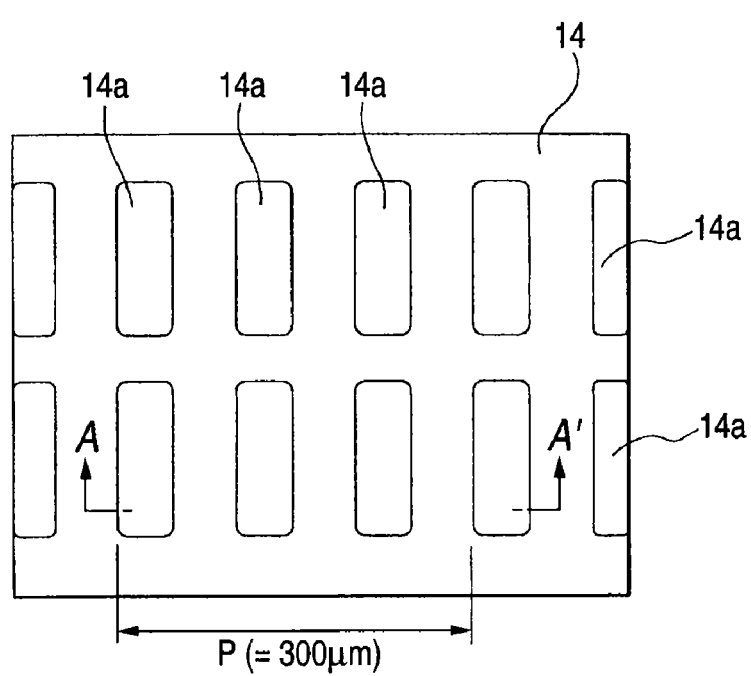
FIG. 8 is a plan view of the receptor substrate used for manufacturing of a display device to which the transfer method according to the third embodiment is applied.

Insulating layers 14 of polyimide in which the first electrodes 13 are opened in a rectangular shape are formed as patterns on the glass substrate 12. FIG. 8 is a plan view of the receptor substrate 11' in a state in which the insulating layers 14 are provided. FIG. 7 corresponds to a section along A-A' in FIG. 8. As shown in FIGS. 7 and 8, openings that open the first electrodes 13 in a rectangular shape in association with pixels 14a are provided in the insulating layers 14. Plural pixels 14a are arranged in a matrix shape on the glass substrate 12. In this case, sub-pixels are formed with three pixels 14a arranged in one direction as one set. A pitch P in one direction of one sub-pixel is set to 300 μm.

As shown in FIG. 7, a hole injection layer 15 and a hole transport layer 16 are formed in this order on the entire surface of the glass substrate 12 to cover the insulating layers 14 and the first electrodes 13. For example, as the hole injection layer 15, m-MTDATA [4,4,4-tris(3-methylphenylphenylamino)triphenylamine] is formed by evaporation with film thickness of 25 nm. Subsequently, as the hole transport layer 16, α-NPD [4,4-bis(N-1-naphthyl-N-phenylamino)biphenyl] is evaporated with film thickness of 30 nm.

Consequently, the receptor substrate 11' is manufactured. In accordance with the procedure described above, plural (for example, more than 3) receptor substrates 11' (11'-1, 11'-2, and 11'-3) are manufactured.

A procedure for manufacturing a display device by applying thermal transfer to the receptor substrate 11' of the structure explained with reference to FIG. 7 using the transfer substrate 1" of the structure explained with reference to FIG. 5 will be explained with reference to sectional views for explaining steps of FIGS. 9A to 9C to FIGS. 11A to 11C. In FIGS. 9A to 9C to FIGS. 11A to 11C, for convenience of explanation, pixel areas larger in number than those in FIGS. 5 and 7 are shown and a structure on the receptor substrate 11' side are shown in a simplified form.

Figure 9A:
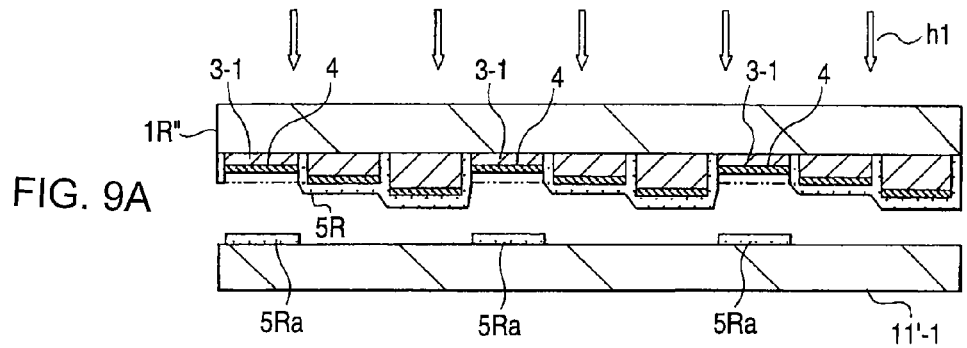
FIGS. 9A to 9C are sectional views for explaining steps of a method of manufacturing a display device to which the transfer method according to the third embodiment is applied.

First, as shown in FIG. 9A, the transfer substrate 1R" that has the red transfer material layer 5R is arranged to be opposed the first receptor substrate 11'-1 to be an object of transfer in a predetermined state. An arrangement state of the transfer substrate 1R" with respect to the receptor substrate 11'-1 is the same as the arrangement state of the transfer substrate and the receptor substrate explained with reference to FIG. 2A in the first embodiment. In this case, alignment is performed such that the antireflection patterns 3-1 having film thickness t1=400 nm are opposed to red pixel portions of the receptor substrate 11'-1.

In this state, light h1 having a wavelength of 800 nm is irradiated from the transfer substrate 1R" side. In this case, the light h1 may be collectively irradiated on a wide area including the antireflection patterns 3-1 and the other antireflection patterns. However, it is important that an amount of irradiation of the light h1 is an amount of irradiation equal to or larger than an amount of irradiation with which the transfer material layer 5R portions on the antireflection patterns 3-1 are sufficiently sublimated and transferred and is an amount of irradiation in a range in which the transfer material layer 5R portions other than those on the antireflection patterns 3-1 are not sublimated.

Consequently, the light h1 is absorbed and converted into heat in the light absorbing layers 4 as well as the antireflection patterns 3-1 and the transfer material layer 5R portions on the antireflection patterns 3-1 are thermally transferred to the receptor substrate 11'-1 side selectively to form red light emitting layers 5Ra as functional layers.

Figure 9B:
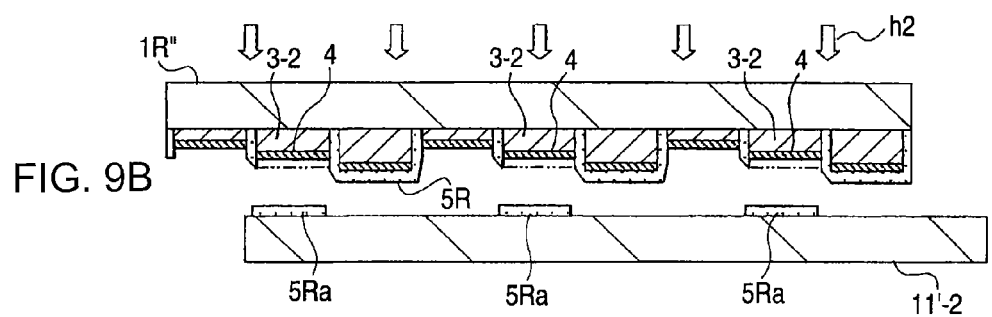

As shown in FIG. 9B, in the same predetermined state, the transfer substrate 1R" is arranged to be opposed to the second receptor substrate 11'-2 to be an object of transfer next. However, in this case, alignment is performed such that the antireflection patterns 3-2 having film thickness t2=72 nm are opposed to red pixel portions of the receptor substrate 11'-2.

In this state, light h2 having a wavelength of 488 nm is irradiated from the transfer substrate 1R" side. In this case, the light h2 may be collectively irradiated on a wide area including the antireflection patterns 3-2 and the other antireflection patterns. However, it is important that an amount of irradiation of the light h2 is an amount of irradiation equal to or larger than an amount of irradiation with which the transfer material layer 5R portions on the antireflection patterns 3-2 are sufficiently sublimated and transferred and is an amount of irradiation in a range in which the transfer material layer 5R portions other than those on the antireflection patterns 3-2 are not sublimated.

Consequently, the light h2 is absorbed and converted into heat in the light absorbing layers 4 as well as the antireflection patterns 3-2 and the transfer material layer 5R portions on the antireflection patterns 3-2 are thermally transferred to the receptor substrate 11'-2 side selectively to form the red light emitting layers 5Ra as functional layers.

Figure 9C:
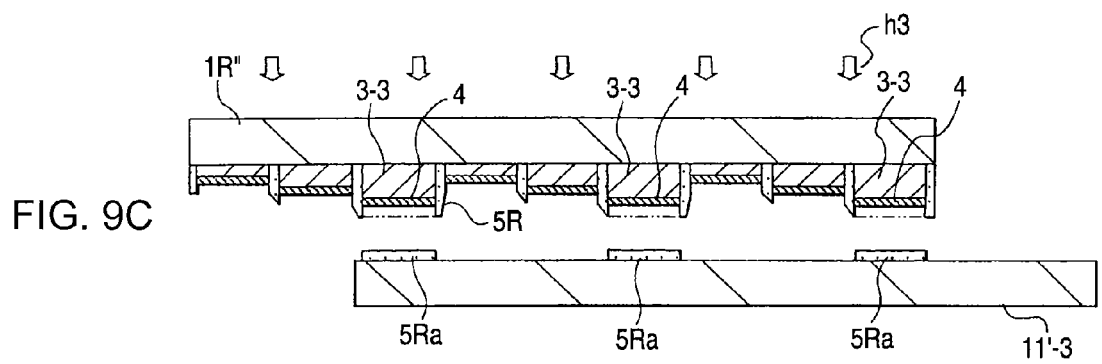

As shown in FIG. 9C, in the same predetermined state, the transfer substrate 1R" is arranged to be opposed to the third receptor substrate 11'-3 to be an object of transfer next. However, in this case, alignment is performed such that the antireflection patterns 3-3 having film thickness t3=85 nm are opposed to red pixel portions of the receptor substrate 11'-3.

In this state, light h3 having a wavelength of 532 nm is irradiated from the transfer substrate 1R" side. In this case, the light h3 may be collectively irradiated on a wide area including the antireflection patterns 3-3 and the other antireflection patterns. However, it is important that an amount of irradiation of the light h3 is an amount of irradiation equal to or larger than an amount of irradiation with which the transfer material layer 5R portions on the antireflection patterns 3-3 are sufficiently sublimated and transferred and is an amount of irradiation in a range in which the transfer material layer 5R portions other than those on the antireflection patterns 3-3 are not sublimated.

Consequently, the light h3 is absorbed and converted into heat in the light absorbing layers 4 as well as the antireflection patterns 3-3 and the transfer material layer 5R portions on the antireflection patterns 3-3 are thermally transferred to the receptor substrate 11'-3 side selectively to form the red light emitting layers 5Ra as functional layers.

As described above, pattern formation of the red light emitting layers 5Ra by thermal transfer is applied to the three receptor substrates 11'-1, 11'-2, and 11'-3 using one transfer substrate 1R". The steps in FIGS. 9A to 9C may be performed in any order from any one of the steps.

Figure 10A:
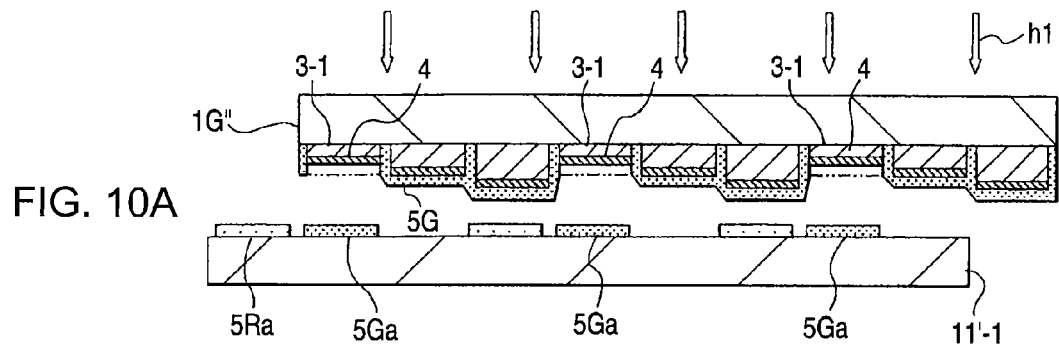
FIGS. 10A to 10C are sectional views for explaining steps of the method of manufacturing a display device to which the transfer method according to the third embodiment is applied.
Figure 10B:
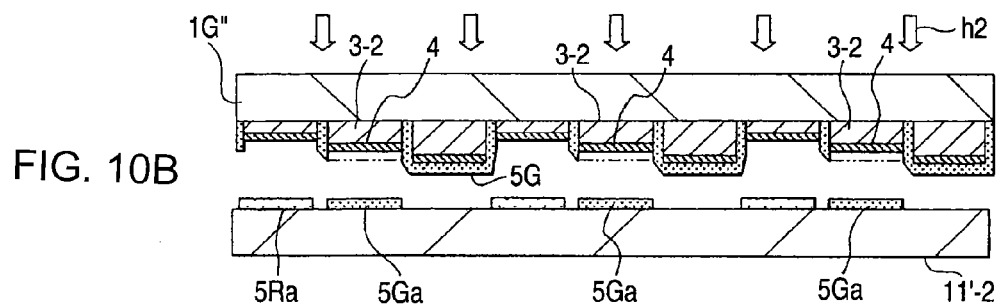
Figure 10C:
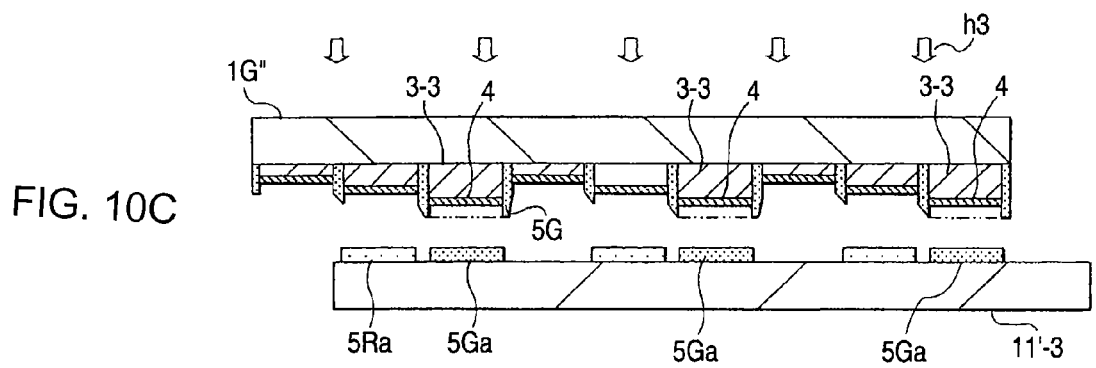

After that, as shown in FIGS. 10A to 10C, using the receptor substrate 1G" having the green transfer material layers 5G, pattern formation of green light emitting layers 5Ga by thermal transfer is applied to the respective receptor substrates 11'-1, 11'-2, and 11'-3, on which the red light emitting layers 5Ra have already been formed, by the same procedure as the procedure explained with reference to FIGS. 9A to 9C.

Figure 11A:
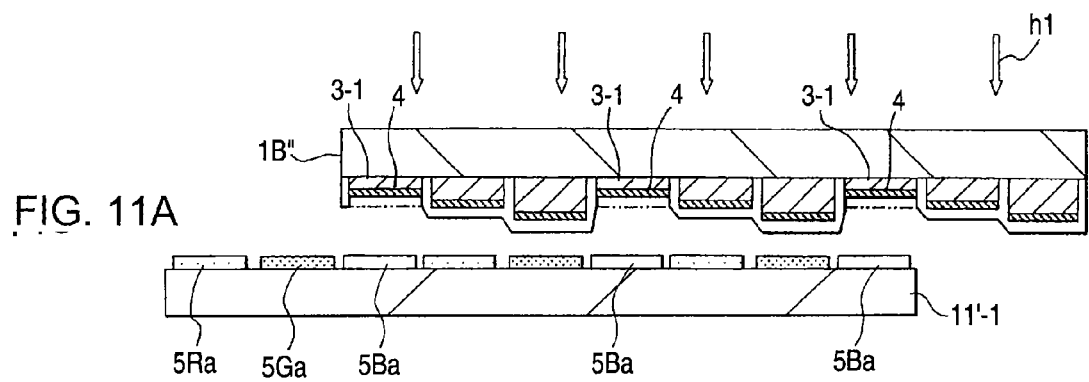
FIGS. 11A to 11C are sectional views for explaining steps of the method of manufacturing a display device to which the transfer method according to the third embodiment is applied.
Figure 11B:
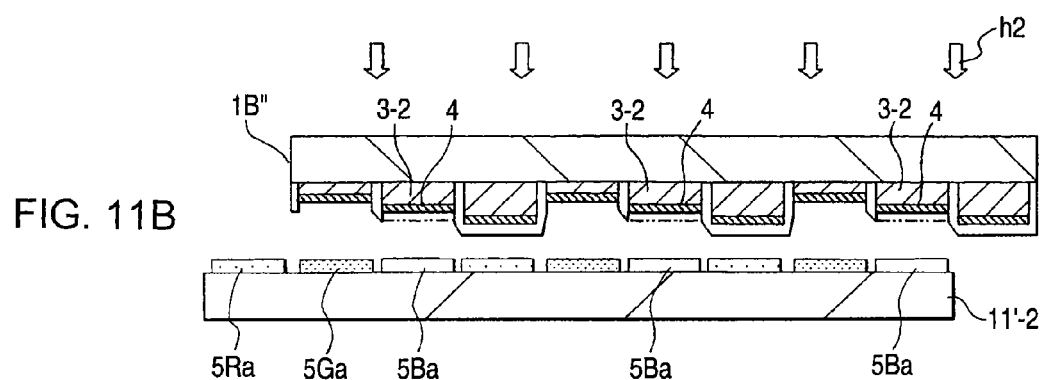
Figure 11C:
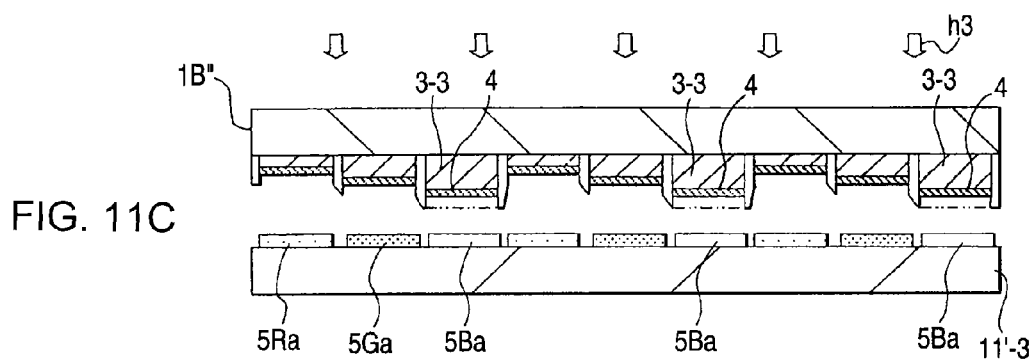

As shown in FIGS. 11A to 11C, using the transfer substrate 1B" having the blue transfer material layers 5B, pattern formation of blue light emitting layers 5Ba by thermal transfer is applied to the respective receptor substrates 11'-1, 11'-2, and 11'-3, on which the red light emitting layers 5Ra and the green light emitting layers 5Ga have already been formed, by the same procedure as the procedure explained with reference to FIGS. 9A to 9C.

The light emitting layers 5Ra, 5Ga, and 5Ba explained with reference to FIGS. 9A to 9C to FIGS. 11A to 11C may be formed in order from any one of the light emitting layers.

Figure 12A:
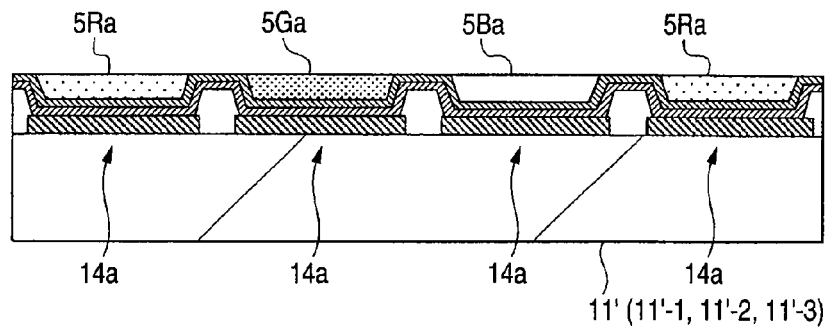
FIGS. 12A and 12B are sectional views for explaining steps of the method of manufacturing a display device to which the transfer method according to the third embodiment is applied.

In this way, as shown in FIG. 12A, the respective light emitting layers 5Ra, 5Ga, and 5Ba are formed on the respective pixels 14a in the respective receptor substrates 11' (11'-1, 11'-2, and 11'-3).

Figure 12B:
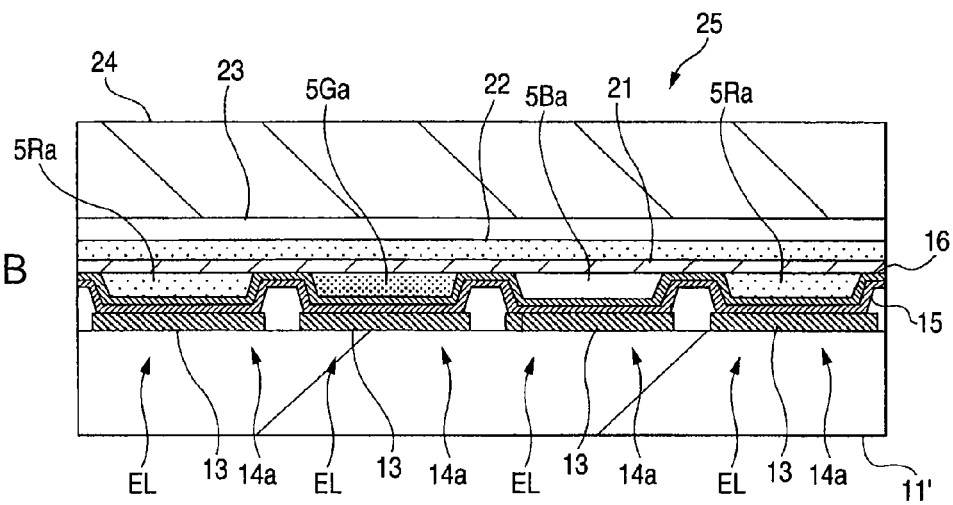

Thereafter, as shown in FIG. 12B, 8-hydroxyquinolinealuminum (Alq3) is evaporated and formed with film thickness of about 20 nm as an electron transport layer 21 on the receptor substrate 11' to cover the entire surface of the display area on which the respective pixels 14a are arranged. LiF is evaporated and formed with film thickness of about 0.3 nm (evaporation speed: 0.01 nm/sec) as an electron injection layer 22.

Subsequently, MgAg is evaporated and formed with film thickness of about 10 nm as a second electrode 23. The second electrode 23 is formed as a cathode common to the respective pixels 14a. When the display device to be manufactured is a top emission type, the second electrode is formed to be transparent or translucent. On the other hand, when the display device is a transmission type, the second electrode 23 is formed of a highly reflective material. In this case, the formation of the second electrode 23 is performed by a film formation method with small energy of film formation particles, for example, the evaporation method or the CVD (chemical vapor deposition) method to a degree not affecting a base. Desirably, without exposing an organic layer including a light emission layer below the second electrode 23 to the atmosphere, the formation of the second electrode 23 is continuously performed in a device identical with a device in which the organic layer is formed. Consequently, deterioration of the organic layer due to moisture in the atmosphere is prevented.

Consequently, light emitting elements EL having the functional layers, which are made of the organic materials, including the light emitting layers 5Ra, 5Ga, and 5Ba held therein are formed to be arrayed between the first electrodes 13 serving as anodes and the second electrode 23 serving as a cathode.

An insulating or conductive protective film not shown in the figure is provided on the second electrode 23 formed in the process described above. In this case, the protective film is formed by the film formation method with small energy of film formation particles, for example, the evaporation method or the CVD method to a degree not affecting the base. The formation of the protective film is continuously performed, without exposing the second electrode 23 to the atmosphere, in the device identical with the device in which the second electrode 23 is formed. Consequently, deterioration in the organic layer (the light emitting layer, etc.) due to moisture and oxygen in the atmosphere is prevented.

The protective film is formed, to prevent moisture from reaching the organic layer, with sufficient film thickness using a material having low water permeation properties and water absorption properties. When the display device to be manufactured is the top emission type, the protective film is made of a material that transmits light generated in the organic layer. For example, a transmittance of about 80% is secured.

In particular, the protective film is formed of an insulating material. In other words, an insulating protective film is formed directly on the second electrode 23 of a single layer structure made of a metal thin film.

As such a protective film, it is possible to suitably use an inorganic amorphous insulating material, for example, amorphous silicon ($\alpha$-Si), amorphous silicon carbide ($\alpha$-SiC), amorphous silicon nitride ($\alpha$-Si1-x Nx), or amorphous carbon ($\alpha$-C). Since such an inorganic amorphous insulating material does not form grains, the inorganic amorphous insulating material has low permeability and serves as a satisfactory protective film.

For example, in forming a protective film made of amorphous silicon nitride, the protective film is formed with thickness of 2 to 3 μm by the CVD method. However, in this case, it is desirable to set a film formation temperature to a room temperature in order to prevent deterioration in luminance due to deterioration of the organic layer and form a film under a condition for minimizing stress of the film in order to prevent peeling of the protective film.

When the protective film is formed of a conductive material, a transparent conductive material such as ITO or IXO is used.

After the protective film is formed as described above, when necessary, a glass substrate 24 is closely attached onto the protective film via ultraviolet curing resin to complete a display device 25.

In the display device 25 explained above, the first electrodes 13 may be set as cathodes and the second electrode 23 may be set as an anode. In this case, the laminated structure between the first electrodes 13 and the second electrode 23 only has to be reversed. When the display device 25 is the transmission type, the first electrodes 13 only has to be formed of a transparent material or a translucent material.

According to the third embodiment described above, as shown in FIG. 5, using the transfer substrates 1″ (1R″, 1G″, and 1B″) including the antireflection patterns 3-1 to 3-3 having the different film thicknesses t1 to t3, the lights h1 to h3 having wavelengths with which light absorptances in the respective antireflection patterns 3-1 to 3-3 are maximized are irradiated on the transfer substrates 1″ at different timings. Consequently, the transfer material layer 5 portions on the respective antireflection patterns 3-1 to 3-3 are formed on the respective receptor substrate 11′ at different timings.

Therefore, in the transfer material layer 5 portions on the respective antireflection patterns 3-1 to 3-3, even when the lights h1 to h3 having the respective wavelengths are irradiated in a wide range, it is possible to collectively transfer only portions corresponding to the lights h1 to h3 having the respective wavelengths to the receptor substrate 11′ as patterns of the light emitting layers 5Ra, 5Ga, and 5Ba of the respective colors. Accordingly, as in the first embodiment, it is possible to realize improvement of production efficiency in the formation of the light emitting layers 5Ra, 5Ga, and 5Ba serving as transfer patterns. In the irradiation of the lights h1 to h3 having the respective wavelengths, it is possible to efficiently absorb the lights in the light absorbing layer 4 portions on the respective antireflection patterns 3-1 to 3-3 corresponding to the lights. Thus, it is possible to realize improvement of efficiency of use of the lights h1 to h3.

It is possible to transfer light emitting layers to three receptor substrates 11′ as patterns using one transfer substrate 1″. This makes it possible to transfer most of the transfer material layer 5 on one transfer substrate 1″ to the receptor substrate 11′. Therefore, it is possible to transfer the transfer material layer 5 formed on the receptor substrate 11′ and form light emitting layers without waste and it is possible to realize a reduction in manufacturing cost of a display device to which such a transfer method is applied.

As explained above, according to the embodiments of the invention, it is possible to form transfer patterns while causing the light absorbing layer to most efficiently absorb irradiated light by irradiating light on a wide area including the antireflection patterns. This makes it possible to realize improvement of production efficiency in formation of the transfer patterns and manufacturing of a display device to which this transfer is applied.

It should be understood by those skilled in the art that various modifications, combinations, sub-combinations, and alterations may occur depending on design requirements and the other factors insofar as they are within the scope of the appended claims or the equivalents thereof.

What is claimed is:

1. A transfer substrate comprising a transfer material layer on a support substrate via a light absorbing layer, wherein
    antireflection patterns for preventing light reflection on an interface of the support substrate and the light absorbing layer are provided between the support substrate and the light absorbing layer, and
    the antireflection patterns have film thickness with which an absorptance of light having a predetermined wavelength absorbed in the light absorbing layer is maximized.

2. A transfer substrate according to claim 1, wherein the antireflection patterns are formed according to transfer patterns formed on a receptor substrate.

3. A transfer substrate according to claim 1, wherein the antireflection patterns have plural film thicknesses such that absorptances of lights having plural different wavelengths absorbed in the light absorbing layer are maximized, respectively.

* * * * *